(12) United States Patent
Muramatsu et al.

(10) Patent No.: US 11,088,190 B2
(45) Date of Patent: Aug. 10, 2021

(54) OPTICAL SEMICONDUCTOR DEVICE

(71) Applicant: HAMAMATSU PHOTONICS K.K., Hamamatsu (JP)

(72) Inventors: Masaharu Muramatsu, Hamamatsu (JP); Yasuhito Miyazaki, Hamamatsu (JP); Hirotaka Takahashi, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 15/942,684

(22) Filed: Apr. 2, 2018

(65) Prior Publication Data

US 2018/0286898 A1 Oct. 4, 2018

(30) Foreign Application Priority Data

Apr. 4, 2017 (JP) .............................. JP2017-074501

(51) Int. Cl.
*H01L 27/146* (2006.01)

(52) U.S. Cl.
CPC .... *H01L 27/1463* (2013.01); *H01L 27/14687* (2013.01)

(58) Field of Classification Search
CPC ...................... H01L 27/1463; H01L 27/14687
See application file for complete search history.

(56) References Cited

U.S. PATENT DOCUMENTS

| 6,274,905 | B1* | 8/2001 | Mo | H01L 21/28061 |
| | | | | 257/330 |
| 7,154,136 | B2* | 12/2006 | Cole | H01L 27/1463 |
| | | | | 257/292 |
| 9,698,197 | B2* | 7/2017 | Xu | H01L 27/153 |
| 2002/0197823 | A1* | 12/2002 | Yoo | H01L 21/76232 |
| | | | | 438/424 |
| 2003/0089946 | A1* | 5/2003 | Hshieh | H01L 21/28185 |
| | | | | 257/338 |
| 2007/0221973 | A1* | 9/2007 | Nagasaki | H01L 27/1463 |
| | | | | 257/292 |
| 2008/0029796 | A1* | 2/2008 | Mori | H01L 27/1463 |
| | | | | 257/292 |
| 2008/0102557 | A1* | 5/2008 | Kim | H01L 21/76224 |
| | | | | 438/73 |
| 2008/0217719 | A1* | 9/2008 | Liu | H01L 27/1463 |
| | | | | 257/446 |
| 2010/0148230 | A1* | 6/2010 | Stevens | H01L 21/76224 |
| | | | | 257/290 |

(Continued)

FOREIGN PATENT DOCUMENTS

| CN | 101261957 A | 9/2008 |
| CN | 102683358 A | 9/2012 |

(Continued)

*Primary Examiner* — Eugene Lee
(74) *Attorney, Agent, or Firm* — Faegre Drinker Biddle & Reath LLP (57) ABSTRACT

An optical semiconductor device includes a semiconductor substrate having a plurality of photoelectric conversion parts and having a trench formed to separate the plurality of photoelectric conversion parts from each other, an insulating layer formed on at least an inner surface of the trench, a boron layer formed on the insulating layer, and a metal layer formed on the boron layer.

8 Claims, 7 Drawing Sheets

(56) References Cited

U.S. PATENT DOCUMENTS

| | | | | |
|---|---|---|---|---|
| 2010/0314672 | A1* | 12/2010 | Manda | H01L 27/14609 |
| | | | | 257/292 |
| 2011/0095302 | A1* | 4/2011 | Hikichi | H01L 29/456 |
| | | | | 257/77 |
| 2012/0256289 | A1* | 10/2012 | Borsari | H01L 29/0649 |
| | | | | 257/506 |
| 2013/0056809 | A1* | 3/2013 | Mao | H01L 27/14614 |
| | | | | 257/292 |
| 2015/0115388 | A1* | 4/2015 | Eda | H01L 27/14612 |
| | | | | 257/446 |
| 2015/0124140 | A1 | 5/2015 | Ohkubo et al. | |
| 2016/0043130 | A1* | 2/2016 | Ohguro | H01L 27/1463 |
| | | | | 257/225 |
| 2016/0284746 | A1* | 9/2016 | Fukase | H01L 27/1463 |

FOREIGN PATENT DOCUMENTS

| | | |
|---|---|---|
| JP | S60-233851 A | 11/1985 |
| JP | 2003-086827 A | 3/2003 |
| JP | 2007-288136 A | 11/2007 |
| JP | 2010-245499 A | 10/2010 |
| TW | I562345 B | 12/2016 |
| TW | 201712858 A | 4/2017 |

* cited by examiner

OPTICAL SEMICONDUCTOR DEVICE

TECHNICAL FIELD

The present disclosure relates to an optical semiconductor device.

BACKGROUND

An optical semiconductor device which includes a semiconductor substrate having a plurality of photoelectric conversion parts and in which trenches are formed in the semiconductor substrate to separate the respective photoelectric conversion parts from each other is known (for example, Japanese Unexamined Patent Publication No. 2003-86827). Further, an optical semiconductor device which includes a semiconductor substrate having a photoelectric conversion part and a signal output part and in which trenches are formed in the semiconductor substrate to separate the photoelectric conversion part from the signal output part is known (for example, Japanese Unexamined Patent Publication No. 2010-245499).

SUMMARY

In the above-described optical semiconductor devices, a metal layer may be formed on an insulating layer on an inner surface of the trenches from the viewpoint that light incident on one of the photoelectric conversion parts adjacent to each other reaching another photoelectric conversion part and becoming noise in the other photoelectric conversion part is more reliably suppressed or the viewpoint that light generated at the signal output part, for example, due to a hot carrier phenomenon reaching a photoelectric conversion part and becoming noise in the photoelectric conversion part is more reliably suppressed. However, for example, in a trench with a narrow and deep opening, it is difficult to form the metal layer at a deepest portion of the trench.

An object of the present disclosure is to provide an optical semiconductor device in which a metal layer is reliably formed on an insulating layer of an inner surface of a trench.

An optical semiconductor device according to one aspect of the present disclosure includes a semiconductor substrate having a plurality of photoelectric conversion parts and having a trench formed to separate the plurality of photoelectric conversion parts from each other, an insulating layer formed on at least an inner surface of the trench, a boron layer formed on the insulating layer, and a metal layer formed on the boron layer.

An optical semiconductor device according to one aspect of the present disclosure includes a semiconductor substrate having a photoelectric conversion part and a signal output part and having a trench formed to separate the photoelectric conversion part from the signal output part, an insulating layer formed on at least an inner surface of the trench, a boron layer formed on the insulating layer, and a metal layer formed on the boron layer.

In the optical semiconductor device, the metal layer is formed on the insulating layer of the inner surface of the trench with the boron layer therebetween. This constitution is based on the fact found by the inventors that the metal layer is stably formed on the boron layer. Therefore, it is possible to obtain an optical semiconductor device in which the metal layer is reliably formed on the insulating layer of the inner surface of the trench.

In the optical semiconductor device according to one aspect, the insulating layer, the boron layer and the metal layer may extend to a main surface of the semiconductor substrate. Therefore, since the metal layer can be connected to, for example, a ground potential on the main surface of the semiconductor substrate, it is possible to prevent the metal layer from electrically floating.

In the optical semiconductor device according to one aspect, the metal layer may be a plating layer. This constitution is based on the fact found by the inventors that the metal layer may be selectively and isotropically formed on the boron layer by a plating treatment. That is, according to the plating process, even in the case of a deep trench of which an opening has a narrow width, the metal layer is reliably formed on the insulating layer of the inner surface of the trench via the boron layer. Therefore, an optical semiconductor device in which the metal layer is more reliably formed on the insulating layer of the inner surface of the trench can be obtained.

According to the present disclosure, it is possible to provide an optical semiconductor device in which a metal layer is reliably formed on an insulating layer of an inner surface of a trench.

DETAILED DESCRIPTION

Hereinafter, an embodiment of the present disclosure will be described in detail with reference to the drawings. In each of the drawings, the same or corresponding parts are designated by the same reference numerals, and duplicated parts may be omitted.

Figure 1:
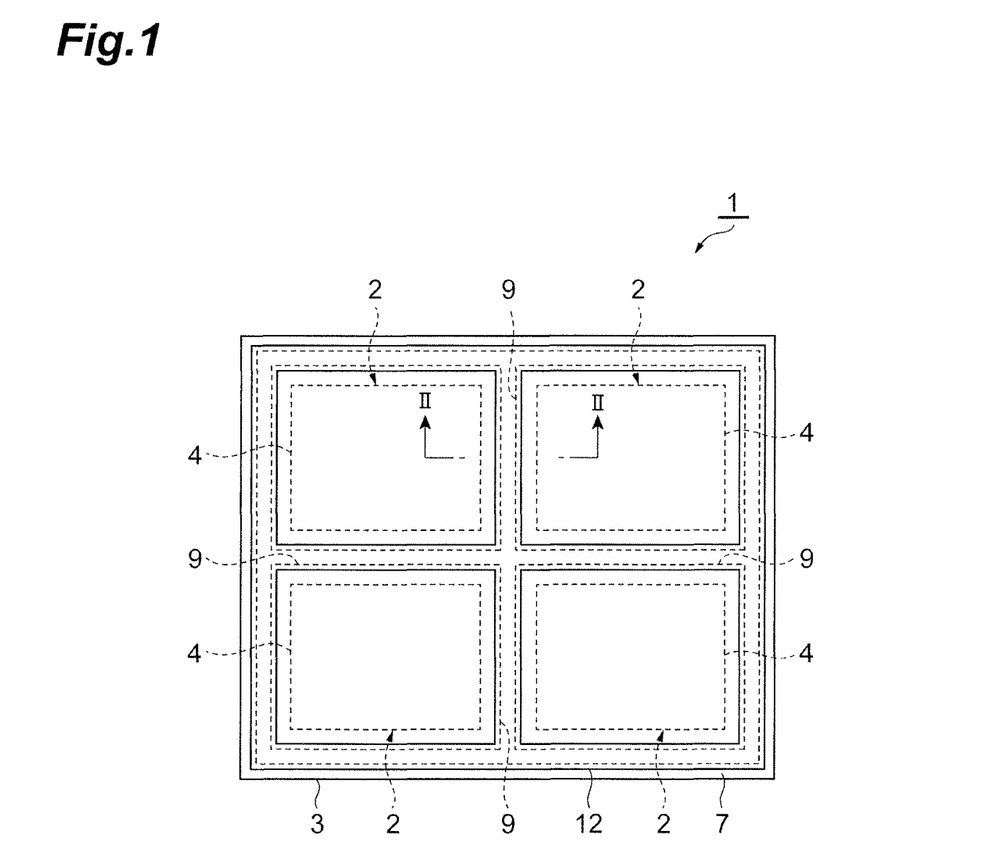
FIG. 1 is a plan view of an optical semiconductor device according to one embodiment.
Figure 2:
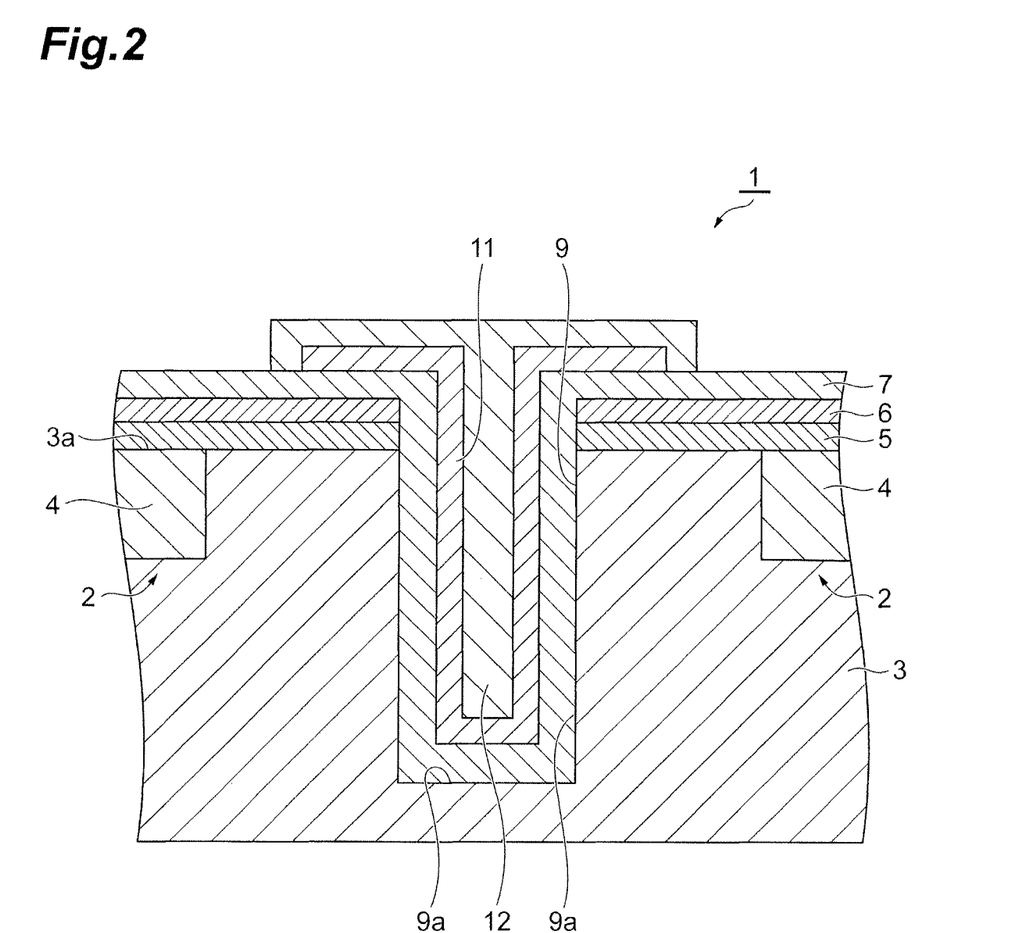
FIG. 2 is a cross-sectional view taken along line II-II illustrated in FIG. 1.

As illustrated in FIGS. 1 and 2, an optical semiconductor device includes a semiconductor substrate 3 having a plurality of photoelectric conversion parts 2. The plurality of photoelectric conversion parts 2 are constituted by forming a plurality of semiconductor layers 4 in a matrix shape on a portion of the semiconductor substrate 3 along a surface (main surface) 3a thereof. Each of the photoelectric conversion parts 2 constitutes a pixel. That is, the optical semiconductor device 1 is a solid-state imaging device. The semiconductor substrate 3 is, for example, a semiconductor substrate formed of p-type silicon (first conductivity type semiconductor substrate). The semiconductor layer 4 is, for example, a semiconductor layer to which an n-type impurity is added (second conductivity type semiconductor layer).

On the surface 3a of the semiconductor substrate 3, insulating layers 5, 6 and 7 are stacked in turn to cover the plurality of semiconductor layers 4. The insulating layers 5 and 7 are, for example, silicon oxide films. The insulating layer 6 is, for example, a silicon nitride film. The insulating layers 5, 6 and 7 serve as gate insulating films or the like, for example. Wires or the like (not illustrated) are also formed on the surface 3a of the semiconductor substrate 3.

Trenches 9 are formed in the semiconductor substrate 3 to separate the photoelectric conversion parts 2 from each other. The trenches 9 opens in the surface 3a of the semiconductor substrate 3. The trenches 9 are formed in a lattice shape to pass between adjacent photoelectric conversion parts 2 when seen in a direction perpendicular to the surface 3a of the semiconductor substrate 3. A width of an opening of each of the trenches 9 is, for example, about 0.5 µm, and a depth of each of the trenches 9 is, for example, about 10 µm.

An insulating layer 7 is formed on an inner surface (specifically, side surfaces and a bottom surface) 9a of the trench 9. That is, the insulating layer 7 extends to an inside of the trench 9 from the insulating layer 6. In other words, the insulating layer 7 extends from the inside of the trench 9 to the surface 3a of the semiconductor substrate 3. A boron layer 11 is integrally (continuously) formed on a portion of the insulating layer 7 formed in the trench 9 and a portion thereof along the opening of the trench 9. That is, the boron layer 11 is formed to continuously cover the entire inner surface 9a of the trench 9 and extends to the surface 3a of the semiconductor substrate 3 from the inside of the trench 9. The boron layer 11 is a layer isotropically formed on the insulating layer 7 with a thickness of a few nm to several tens nm, for example, by a vapor phase growth method such as chemical vapor deposition (CVD) epitaxial growth or the like.

A metal layer 12 is formed on the boron layer 11. That is, the metal layer 12 extends to the surface 3a of the semiconductor substrate 3 from the inside of the trench 9. The metal layer 12 is disposed in the trench 9 without any gaps. The metal layer 12 is a plating layer isotropically formed on the boron layer 11 by a plating process. For example, specific examples of the plating process include electroless metal plating such as electroless Ni/Au plating. The fact that the metal layer 12 may be stably formed on the boron layer 11 and the metal layer 12 may be selectively and isotropically formed on the boron layer 11 by the plating process was confirmed by the inventors.

Figure 3:
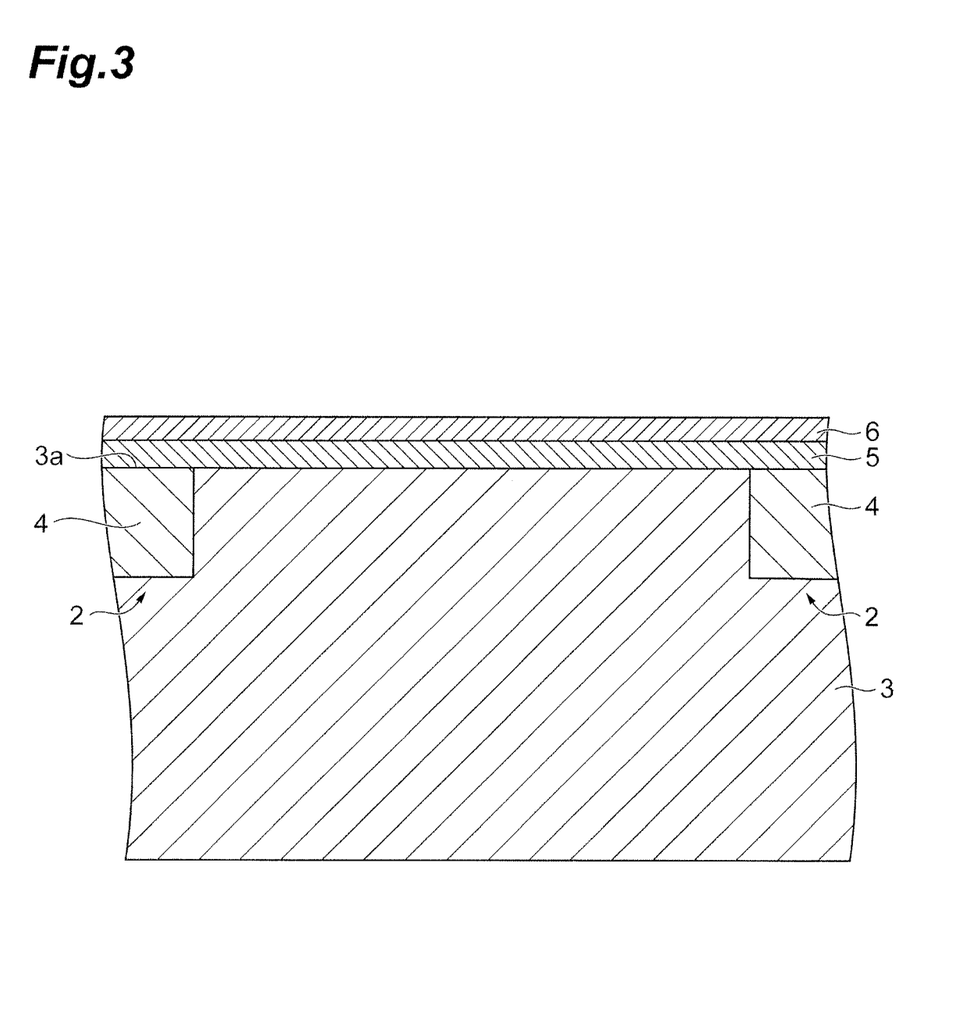
FIG. 3 is a cross-sectional view for explaining a method of manufacturing the optical semiconductor device illustrated in FIG. 1.
Figure 4:
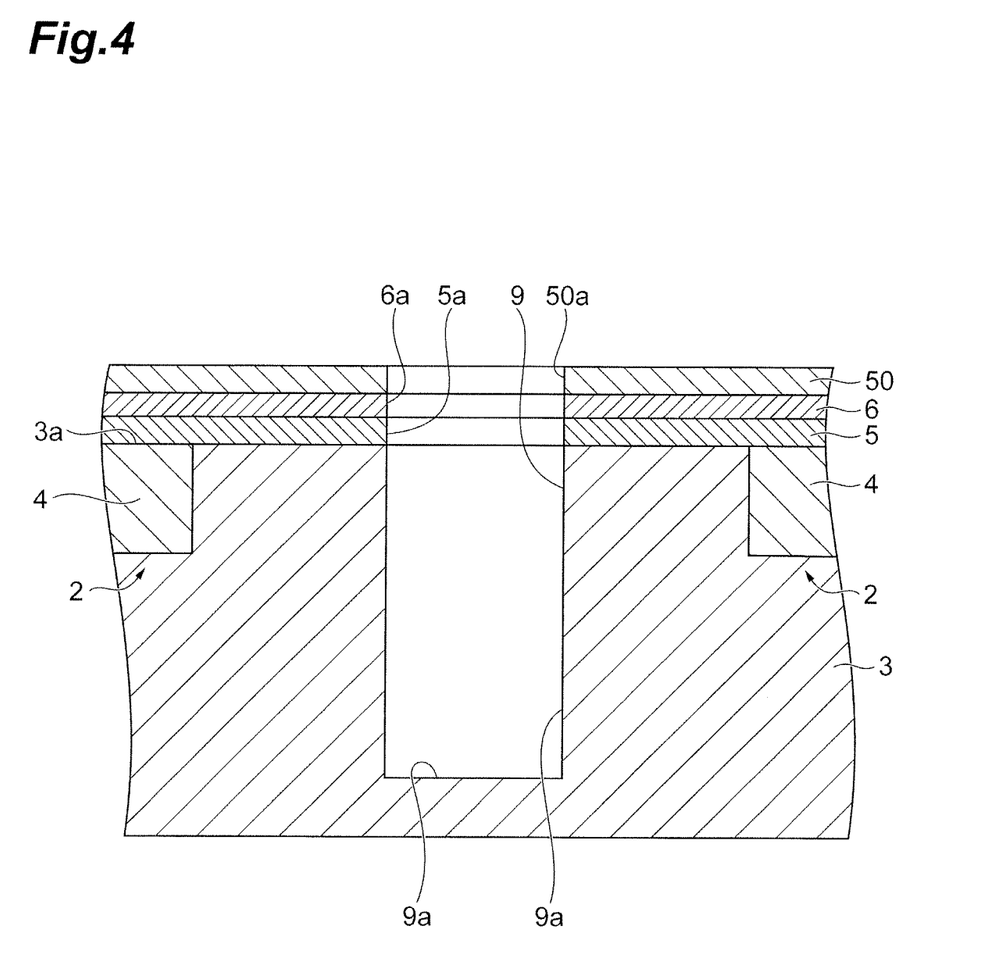
FIG. 4 is a cross-sectional view for explaining the method of manufacturing the optical semiconductor device illustrated in FIG. 1.

A method of manufacturing the optical semiconductor device 1 constituted as described above will be described. First, as illustrated in FIG. 3, the semiconductor substrate 3 having the plurality of photoelectric conversion parts 2 is prepared. Subsequently, the insulating layers 5 and 6 are stacked, in turn, on the surface 3a of the semiconductor substrate 3. Subsequently, as illustrated in FIG. 4, a resist layer 50 is formed on the insulating layer 6, and a slit-shaped opening 50a corresponding to the opening of the trench 9 is formed in the resist layer 50 by photo-etching. Subsequently, slit-shaped openings 6a and 5a corresponding to the opening 50a are formed in the insulating layers 6 and 5 by plasma etching. Subsequently, the trench 9 is formed in the semiconductor substrate 3 by reactive ion etching (RIE). Thus, the trench 9 is formed in the semiconductor substrate 3 to separate the photoelectric conversion parts 2 from each other.

Figure 5:
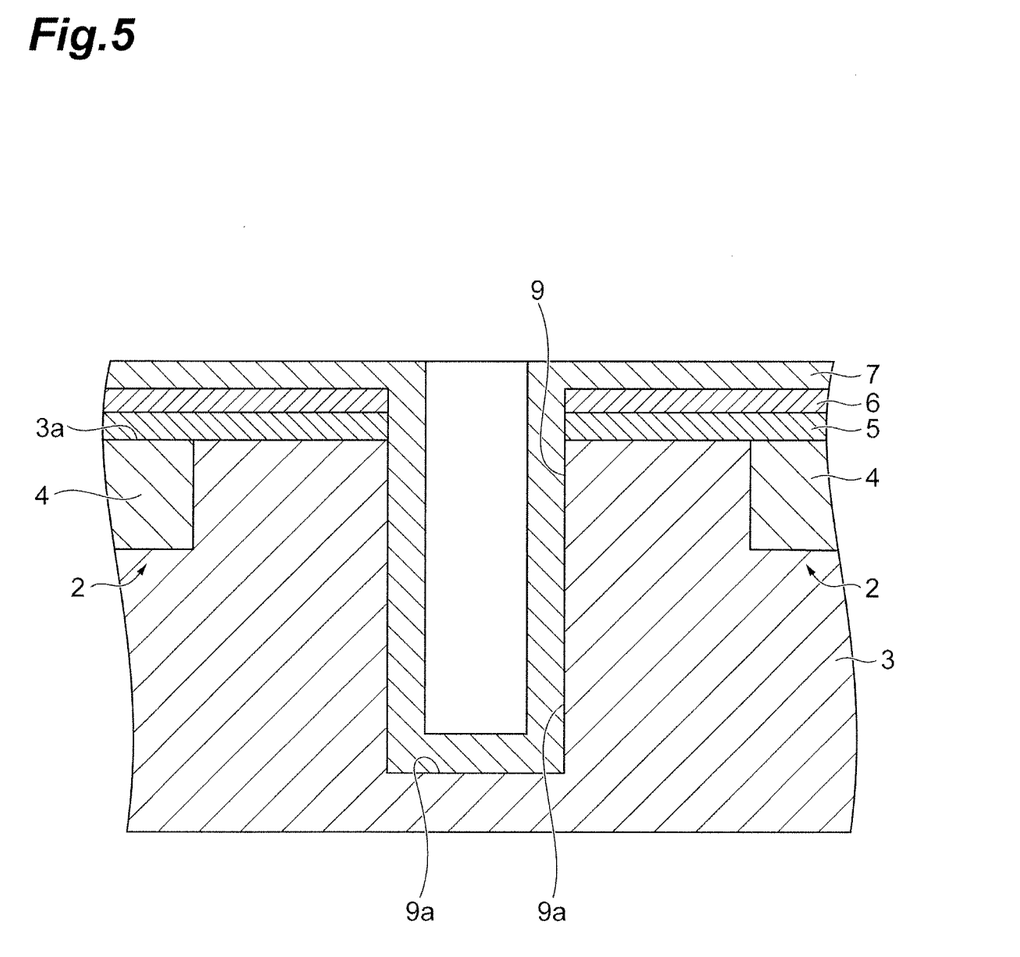
FIG. 5 is a cross-sectional view for explaining the method of manufacturing the optical semiconductor device illustrated in FIG. 1.
Figure 6:
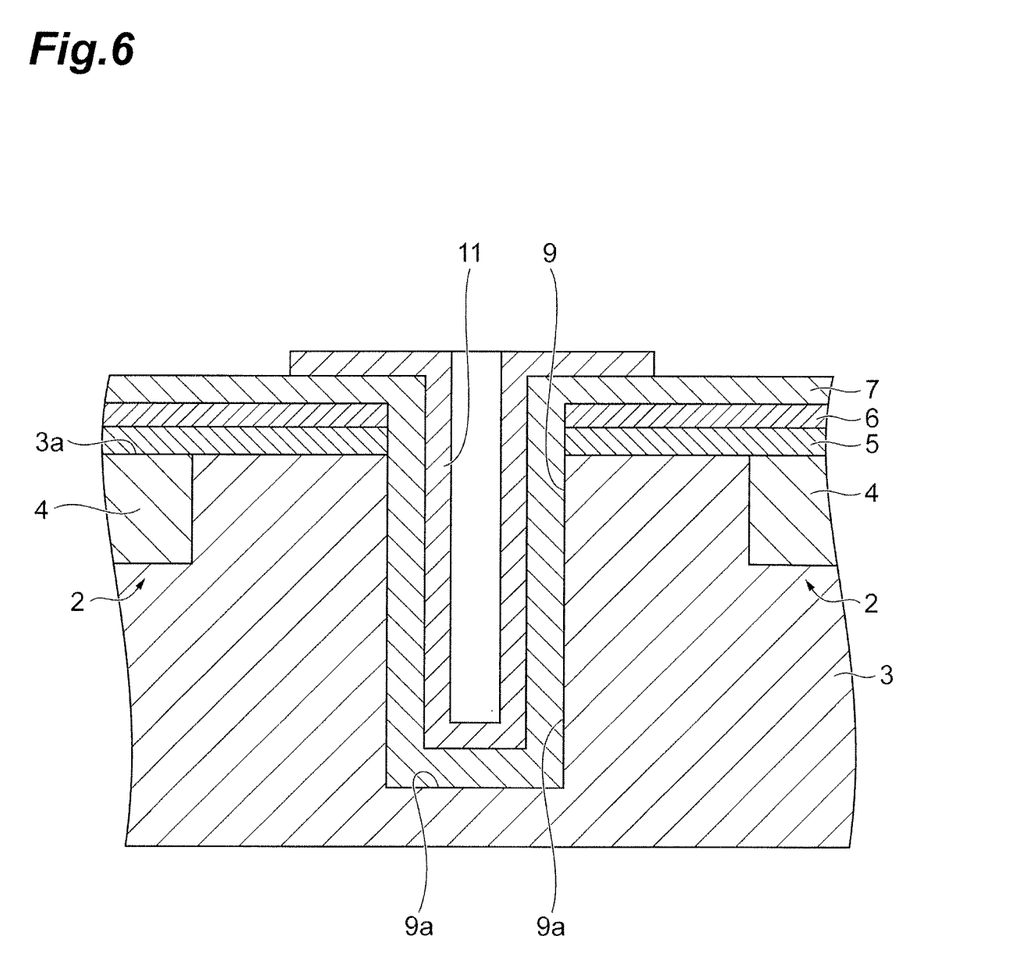
FIG. 6 is a cross-sectional view for explaining the method of manufacturing the optical semiconductor device illustrated in FIG. 1.

Then, the resist layer 50 is removed, and the insulating layer 7 is stacked on the inner surface 9a of the trench 9 and the insulating layer 6 by TEOS-CVD or the like, as illustrated in FIG. 5. Subsequently, as illustrated in FIG. 6, the boron layer 11 is isotropically formed on the insulating layer 7 by the vapor phase growth method, and the boron layer 11 is patterned by dry etching. Subsequently, as illustrated in FIG. 2, the metal layer 12 is selectively and isotropically formed on the boron layer 11 by the plating process. Thus, the optical semiconductor device 1 is obtained. Further, an accumulation layer may be formed in the semiconductor substrate 3 along the inner surface 9a of the trench 9 by performing a thermal diffusion process on the boron layer 11 before performing the plating process. When the accumulation layer is formed in a portion of the semiconductor substrate 3 along the inner surface 9a of the trench 9, generation of a dark current due to a defect occurred in the semiconductor substrate 3 along the inner surface 9a of the trench 9 is suppressed.

As described above, in the optical semiconductor device 1, the metal layer 12 is formed on the insulating layer 7 of the inner surface 9a of the trench 9 via the boron layer 11. This constitution is based on the fact found by the inventors that the metal layer 12 is stably formed on the boron layer 11. Therefore, it is possible to obtain the optical semiconductor device 1 in which the metal layer 12 is reliably formed on the insulating layer 7 of the inner surface 9a of the trench 9. In the optical semiconductor device 1, since the trench 9 is formed in the semiconductor substrate 3 to separate the photoelectric conversion parts 2 from each other and the metal layer 12 is formed in the trench 9, occurrence of crosstalk between adjacent photoelectric conversion parts 2 can be more reliably suppressed.

Further, in the optical semiconductor device 1, the insulating layer 7, the boron layer 11 and the metal layer 12 extend to the surface 3a of the semiconductor substrate 3. Accordingly, since the metal layer 12 can be connected to, for example, a ground potential on the surface 3a of the semiconductor substrate 3, it is possible to prevent the metal layer 12 from electrically floating.

Further, in the optical semiconductor device 1, the metal layer 12 is a plating layer. This configuration is based on the fact found by the inventors that the metal layer 12 is selectively and isotropically formed on the boron layer 11 by a plating process. That is, according to the plating process, even in the case of the trench 9 of which the opening has a narrow width and which is deep, the metal layer 12 is reliably formed on the insulating layer 7 of the inner surface 9a of the trench 9 via the boron layer 11. Therefore, the optical semiconductor device 1 in which the metal layer 12 is more reliably formed on the insulating layer 7 of the inner surface 9a of the trench 9 can be obtained.

Although one embodiment of the present disclosure has been described above, the present disclosure is not limited to the above-described embodiment. For example, a plurality of trenches 9 may be annularly formed to surround each of the photoelectric conversion parts 2 when seen in a direction perpendicular to the surface 3a of the semiconductor substrate 3. In addition, when the optical semiconductor device 1 is a solid-state imaging device, it may be a front surface incident type or a back surface incident type.

Figure 7:
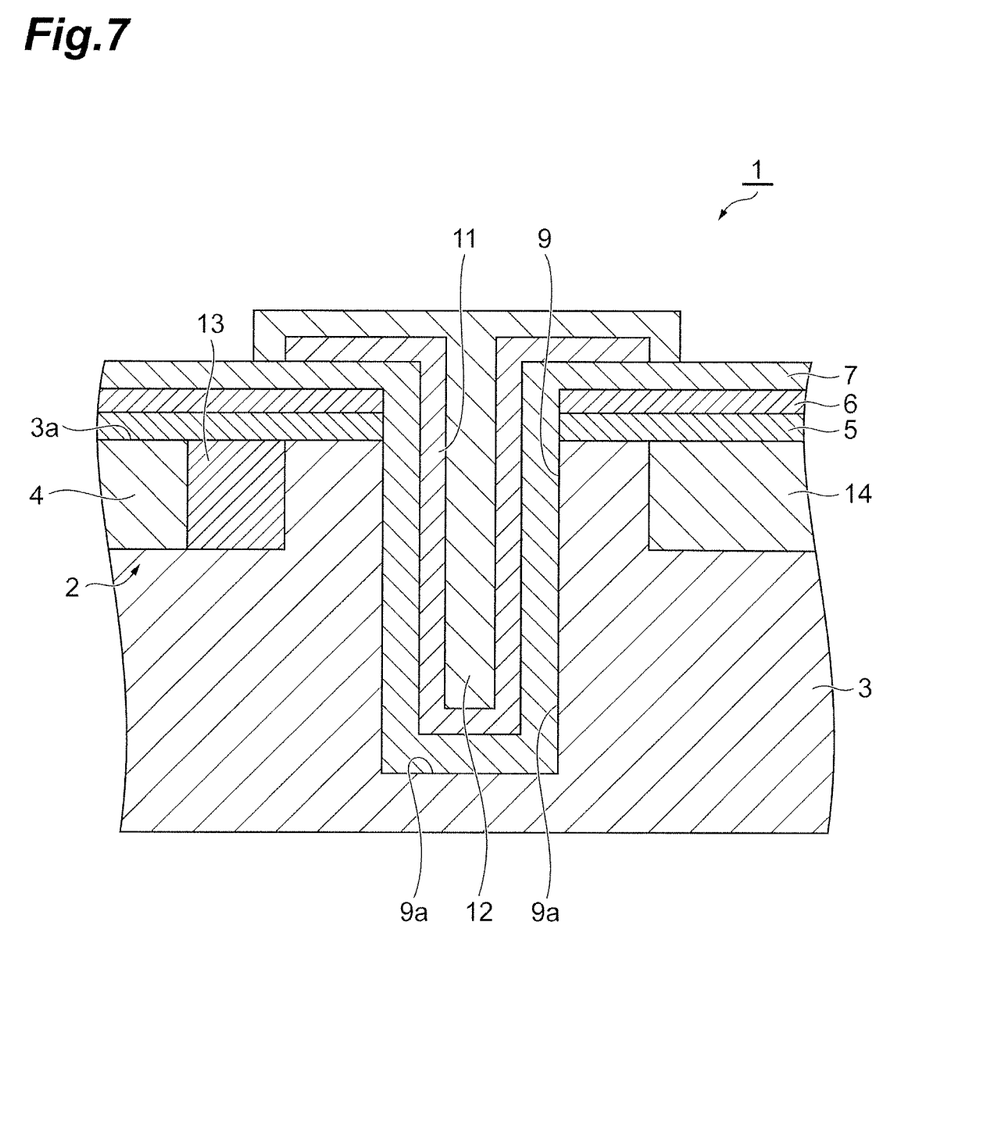
FIG. 7 is a cross-sectional view of a portion of an optical semiconductor device according to another embodiment.

Further, when the optical semiconductor device 1 is, for example, a CCD solid-state imaging device and the photoelectric conversion part 2, a GND part 13, a signal output part 14 and so on are provided in the semiconductor substrate 3 as illustrated in FIG. 7, the trench 9 may be formed in the semiconductor substrate 3 to separate the photoelectric conversion part 2 from the signal output part 14. Here, on a surface of the GND part 13, wiring (not illustrated) which supplies clock signals or voltages for driving a device is laid via an insulating film to charge transferring wiring (not illustrated) laid on a surface of the photoelectric conversion part 2. Further, the signal output part 14 converts an electric charge transferred from the photoelectric conversion part 2 into an electrical signal and then outputs the electrical signal. Also in this case, the insulating layer 7 is formed on at least the inner surface 9a of the trench 9, the boron layer 11 is formed on the insulating layer 7, and the metal layer 12 is formed on the boron layer 11. Therefore, it is possible to obtain the optical semiconductor device 1 in which the metal layer 12 is reliably formed on the insulating layer 7 of the inner surface 9a of the trench 9. In the optical semiconductor device 1 illustrated in FIG. 7, since the trench 9 is formed in the semiconductor substrate 3 to separate the photoelectric conversion part 2 from the signal output part 14 and the metal layer 12 is also formed inside the trench 9, it is possible to more reliably suppress light generated by an amplifier or the like of the signal output part 14 from reaching the photoelectric conversion part 2 and becoming noise in the photoelectric conversion part 2.

In addition, the insulating layer 7 may be formed at least on the inner surface 9a of the trench 9. Further, the insulating layer 7 is not limited to one stacked on the inner surface 9a of the trench 9 and may be a silicon oxide film or the like formed in the semiconductor substrate 3 along the inner surface 9a of the trench 9 by subjecting the inner surface 9a of the trench 9 to a thermal oxidation treatment. In addition, the metal layer 12 is not limited to one disposed in the trench 9 without gaps and may be formed on the boron layer 11 in the trench 9 so that a gap is formed in the trench 9.

What is claimed is:

1. An optical semiconductor device, comprising:
    a semiconductor substrate having a plurality of photoelectric conversion parts and having a trench formed to separate the plurality of photoelectric conversion parts from each other,
    an insulating layer formed on at least an inner surface of the trench,
    a boron layer consisting essentially of boron stacked on the insulating layer by vapor phase growth of boron on the insulating layer, and
    a metal layer formed on the boron layer,
    wherein the metal layer is disposed at least in the trench, and
    wherein the metal layer is formed on the insulating layer formed on the inner surface of the trench, with the boron layer interposed between the metal layer and the insulating layer.

2. An optical semiconductor device, comprising:
    a semiconductor substrate having a photoelectric conversion part and a signal output part and having a trench formed to separate the photoelectric conversion part from the signal output part,
    an insulating layer formed on at least an inner surface of the trench,
    a boron layer consisting essentially of boron stacked on the insulating layer by vapor phase growth of boron on the insulating layer, and
    a metal layer formed on the boron layer,
    wherein the metal layer is disposed at least in the trench, and
    wherein the metal layer is formed on the insulating layer formed on the inner surface of the trench, with the boron layer interposed between the metal layer and the insulating layer.

3. The optical semiconductor device according to claim 1, wherein the insulating layer, the boron layer and the metal layer extend to a main surface of the semiconductor substrate.

4. The optical semiconductor device according to claim 1, wherein the metal layer is a plating layer.

5. The optical semiconductor device according to claim 3, wherein the metal layer is a plating layer.

6. The optical semiconductor device according to claim 2, wherein the insulating layer, the boron layer and the metal layer extend to a main surface of the semiconductor substrate.

7. The optical semiconductor device according to claim 2, wherein the metal layer is a plating layer.

8. The optical semiconductor device according to claim 6, wherein the metal layer is a plating layer.

* * * * *